(12) United States Patent
Lee et al.

(10) Patent No.: US 11,150,545 B2
(45) Date of Patent: Oct. 19, 2021

(54) PROJECTION APPARATUS WITH U-SHAPED PRINTED CIRCUIT BOARD

(71) Applicant: Coretronic Corporation, Hsin-Chu (TW)

(72) Inventors: Hung-Lin Lee, Hsin-Chu (TW); Yun-Lin Miao, Hsin-Chu (TW)

(73) Assignee: Coretronic Corporation, Hsin-Chu (TW)

( * ) Notice: Subject to any disclaimer, the term of this patent is extended or adjusted under 35 U.S.C. 154(b) by 0 days.

(21) Appl. No.: 16/880,993

(22) Filed: May 22, 2020

(65) Prior Publication Data
US 2020/0379325 A1   Dec. 3, 2020

Related U.S. Application Data

(60) Provisional application No. 62/853,726, filed on May 29, 2019.

(30) Foreign Application Priority Data

Dec. 13, 2019 (CN) .......................... 201922230066.0

(51) Int. Cl.
*G03B 21/14* (2006.01)
*G03B 21/16* (2006.01)
(Continued)

(52) U.S. Cl.
CPC ............ *G03B 21/145* (2013.01); *F21S 41/25* (2018.01); *G03B 21/14* (2013.01); *G03B 21/16* (2013.01); *H05K 7/14* (2013.01); *H05K 7/1422* (2013.01)

(58) Field of Classification Search
CPC ...... G03B 21/145; G03B 21/16; G03B 21/14; G03B 21/18; G03B 21/22; G03B 21/26;
(Continued)

(56) References Cited

U.S. PATENT DOCUMENTS

2006/0077353 A1\* 4/2006 Wu ........................ G03B 21/12
353/52
2013/0010268 A1\* 1/2013 Nishima .............. G03B 21/145
353/52
(Continued)

FOREIGN PATENT DOCUMENTS

CN   103869586   6/2014
CN   204437924   7/2015
(Continued)

OTHER PUBLICATIONS

"Search Report of Europe Counterpart Application", dated Oct. 23, 2020, p. 1-p. 5.

*Primary Examiner* — Toan Ton
*Assistant Examiner* — Magda Cruz
(74) *Attorney, Agent, or Firm* — JCIPRNET

(57) ABSTRACT

A projection apparatus including a housing, a light-transmissive cover, an optical engine module, a frame, and a projection apparatus and media player circuit module is provided. The light-transmissive cover is arranged on the housing to cover an opening of the housing. The optical engine module is configured to provide a projection light beam to be transmitted through the light-transmissive cover. The optical engine module is arranged in the housing. The frame is arranged on a top surface of the optical engine module. The frame includes extension arms extending in a direction away from the top surface. The projection apparatus and media player circuit module is configured to drive the optical engine module, and to play a pattern or an image, and is arranged on the extension arms to be distributed on at least two of side surfaces and a bottom surface of the optical engine module.

11 Claims, 8 Drawing Sheets

(51) Int. Cl.
*H05K 7/14*    (2006.01)
*F21S 41/25*   (2018.01)

(58) Field of Classification Search
CPC .... G03B 21/2026; H05K 7/14; H05K 7/1422; F21S 41/25
See application file for complete search history.

(56) References Cited

U.S. PATENT DOCUMENTS

| | | | |
|---|---|---|---|
| 2014/0168617 A1* | 6/2014 | Chiu | G03B 21/14 353/57 |
| 2016/0295177 A1* | 10/2016 | Ko | H04N 9/3164 |
| 2017/0023851 A1* | 1/2017 | Chien | H04N 9/3141 |
| 2017/0368985 A1 | 12/2017 | Yokoyama et al. | |
| 2018/0356712 A1* | 12/2018 | Miyazaki | H04N 9/3141 |
| 2018/0364551 A1* | 12/2018 | Tanaka | G03B 21/145 |
| 2019/0111847 A1* | 4/2019 | Messenger | F21S 43/26 |
| 2020/0186763 A1* | 6/2020 | Chen | G03B 21/16 |

FOREIGN PATENT DOCUMENTS

| | | |
|---|---|---|
| CN | 107817645 | 3/2018 |
| KR | 20090021901 | 3/2009 |

\* cited by examiner

PROJECTION APPARATUS WITH U-SHAPED PRINTED CIRCUIT BOARD

CROSS-REFERENCE TO RELATED APPLICATION

This application claims the priority benefit of U.S. Provisional application Ser. No. 62/853,726, filed on May 29, 2019 and China application serial no. 201922230066.0, filed on Dec. 13, 2019. The entirety of the above-mentioned patent application is hereby incorporated by reference herein and made a part of this specification.

BACKGROUND

Technical Field

The disclosure relates to an optical apparatus, and in particular, to a projection apparatus.

Description of Related Art

A projection apparatus is a display apparatus configured to generate an image of a large size. With the evolution and innovation of science and technology, the projection apparatus is constantly improved. An imaging principle of the projection apparatus is to convert an illumination light beam generated by an illumination system into an image light beam by using a light valve. Then, the image light beam is projected onto a projection target object (such as a screen, a ground, or a wall) by using a projection lens to form a projection image. Projection apparatuses such as a puddle lamp may be arranged in a door of a modern car, so that when a driver opens the door, the puddle lamp may project a specific pattern on the ground. However, in the current technology, the puddle lamp only has an illumination function or displays a static pattern.

The information disclosed in this Background section is only for enhancement of understanding of the background of the described technology and therefore it may contain information that does not form the prior art that is already known to a person of ordinary skill in the art. Further, the information disclosed in the Background section does not mean that one or more problems to be resolved by one or more embodiments of the invention were acknowledged by a person of ordinary skill in the art.

SUMMARY

The disclosure provides a projection apparatus, in which a circuit structure may be designed to be not distributed on a single plane, so that the circuit design and planning have good space utilization.

Other objectives and advantages of the disclosure may be further understood through the technical features disclosed in the disclosure.

To achieve one or some or all of objectives, or other objective, embodiments of the disclosure provide a projection apparatus, including a housing, a light-transmissive cover, an optical engine module, a frame, and a projection apparatus and media player circuit module. The housing includes an opening. The light-transmissive cover is arranged on the housing to cover the opening of the housing. The optical engine module is configured to provide a projection light beam to be transmitted through the light-transmissive cover. The optical engine module is arranged in the housing. The frame is arranged on a top surface of the optical engine module. The frame includes a plurality of extension arms extending in a direction away from the top surface. The projection apparatus and media player circuit module is configured to drive the optical engine module, and to play a pattern or an image, and is arranged on the extension arms, to be distributed on at least two of a plurality of side surfaces and a bottom surface of the optical engine module, and the side surfaces are perpendicular to the top surface.

Based on the above, the embodiments of the disclosure at least have one of the following advantages or effects. In the projection apparatus in the disclosure, the projection apparatus and media player circuit module may be planned to be arranged on a top surface of the frame and between adjacent extension arms. Therefore, a circuit structure may be designed to be not distributed on a single plane, so that the circuit design and planning have good space utilization. In this way, a goal of satisfying a full-function specification design can be achieved by increasing circuit design space, reducing a combination time, and reducing a volume.

Other objectives, features and advantages of the present invention will be further understood from the further technological features disclosed by the embodiments of the present invention wherein there are shown and described preferred embodiments of this invention, simply by way of illustration of modes best suited to carry out the invention.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1A:
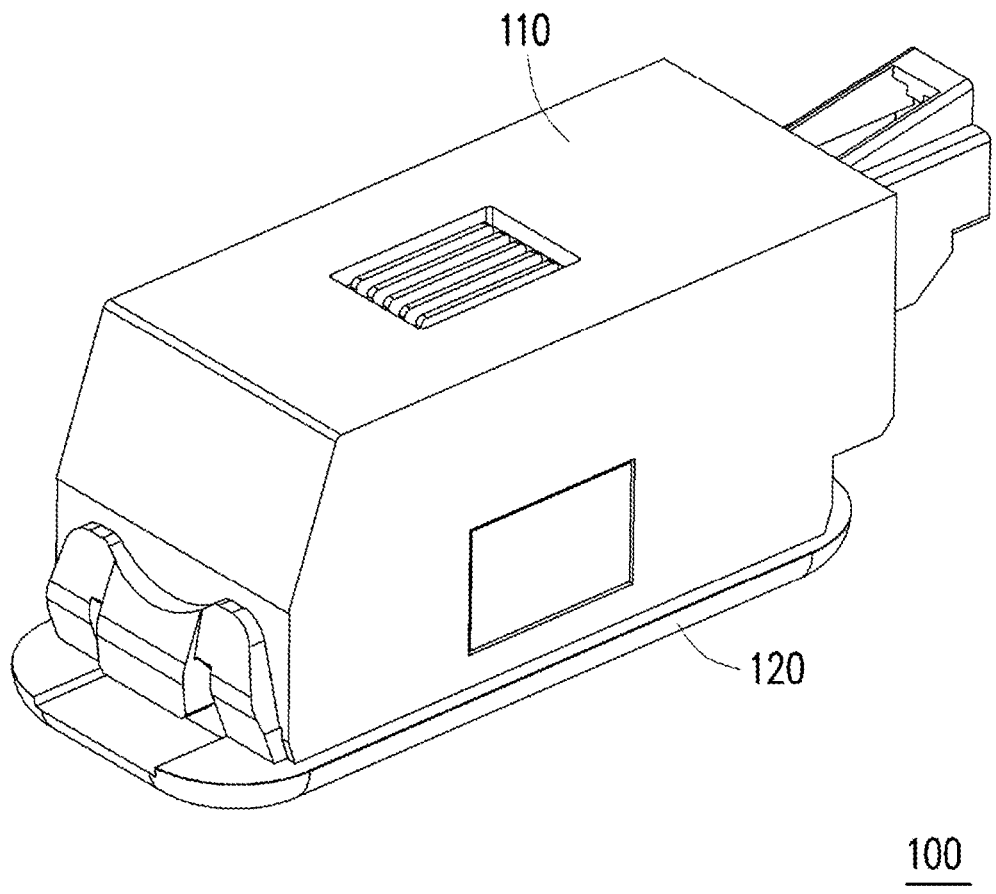
FIG. 1A and FIG. 1B are respectively three-dimensional schematic views of a projection apparatus in the disclosure from different angles of view.
Figure 1B:
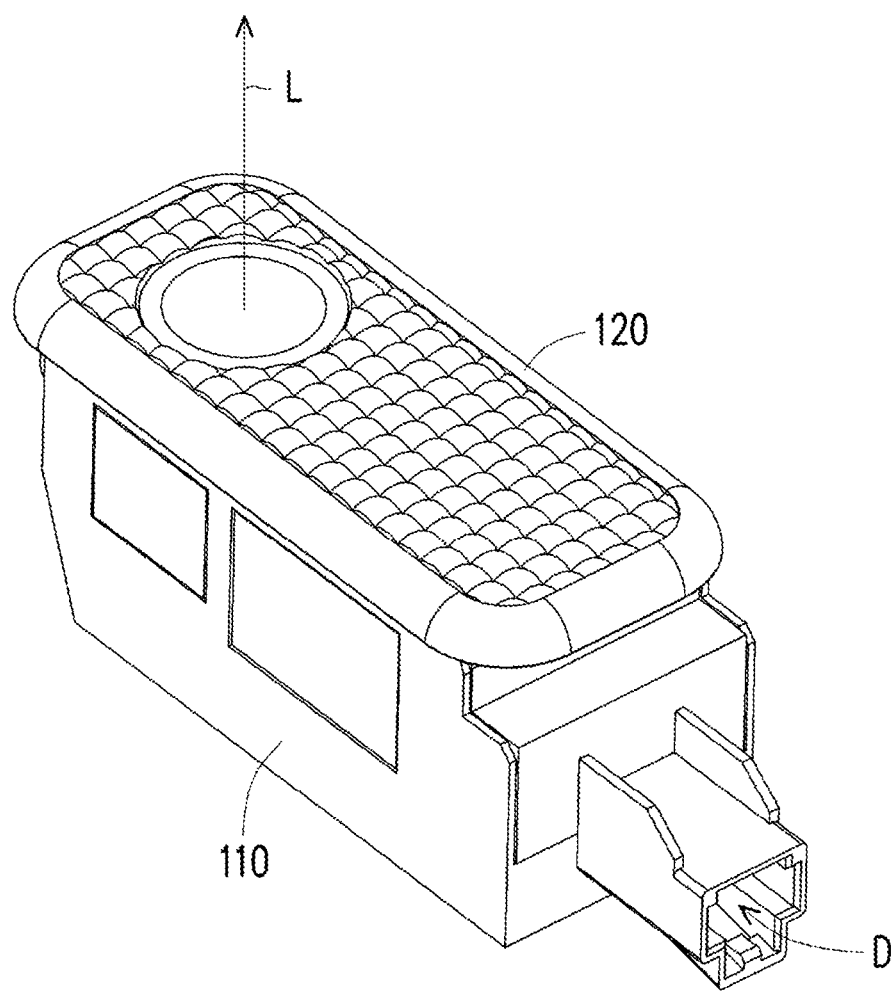
Figure 2A:
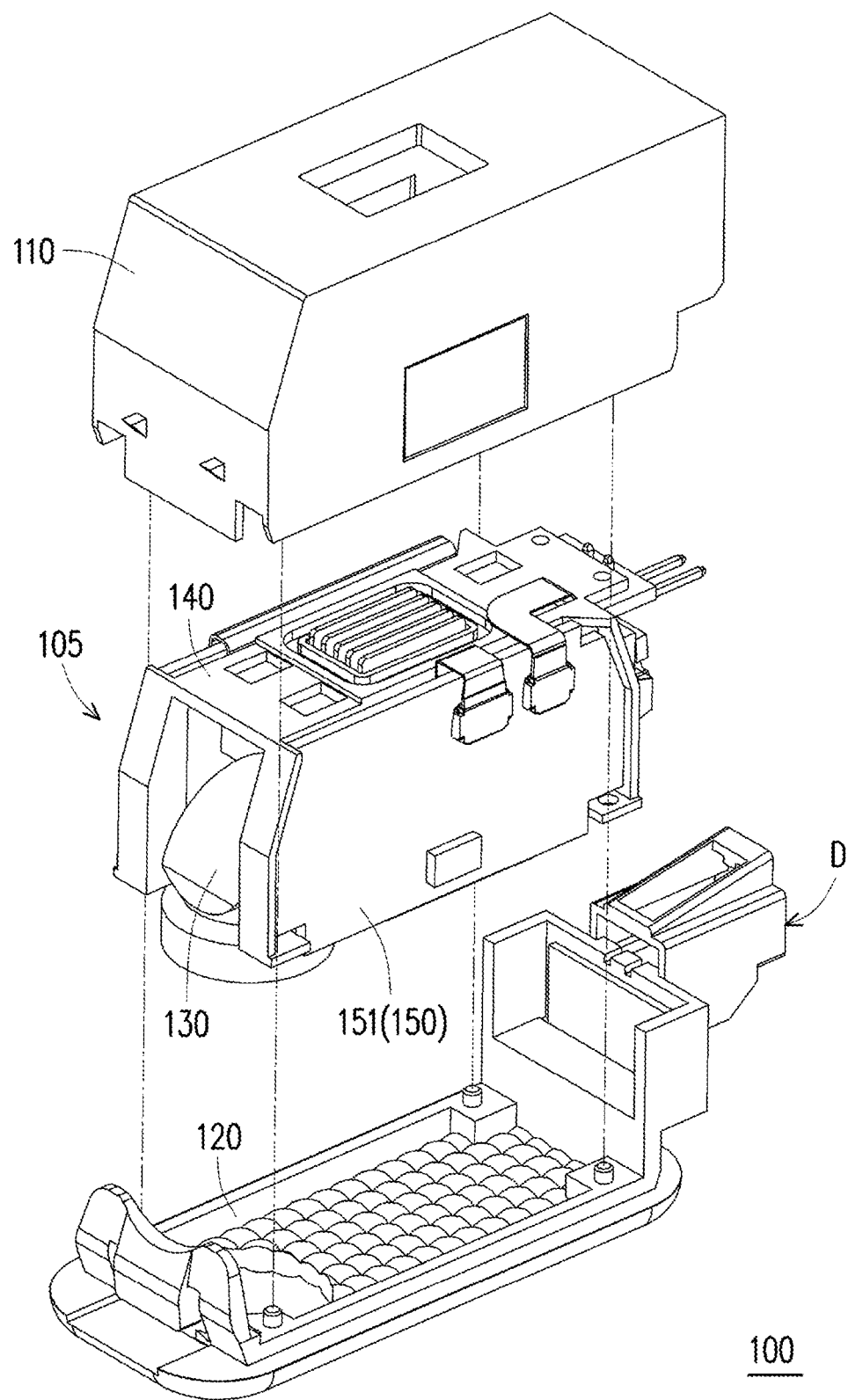
FIG. 2A and FIG. 2B are respectively three-dimensional exploded views of a part of the projection apparatus in FIG. 1A and FIG. 1B.
Figure 2B:
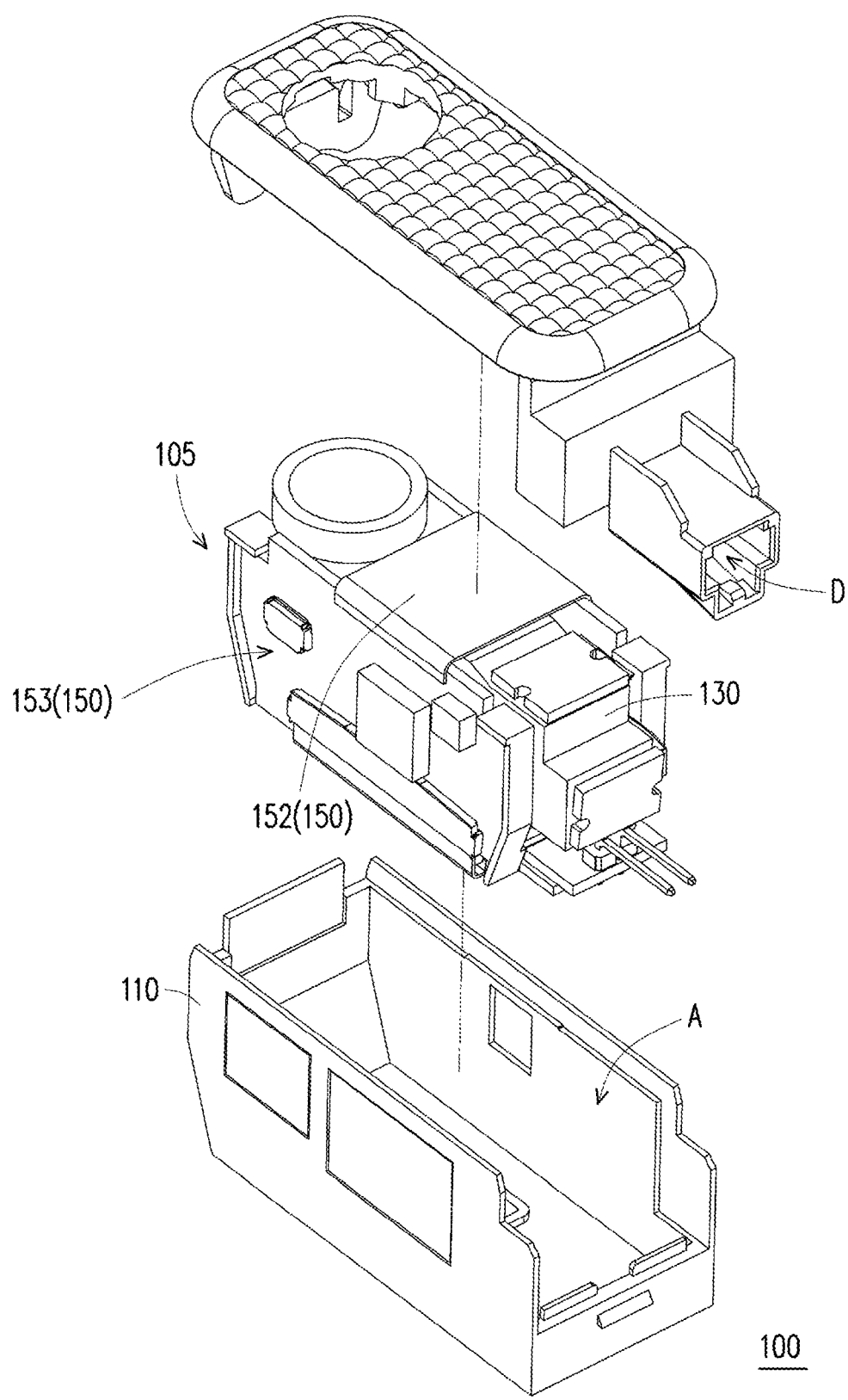

FIG. 1A and FIG. 1B are respectively schematic three-dimensional diagrams of a projection apparatus in the disclosure from different view angles. FIG. 2A and FIG. 2B are respectively three-dimensional exploded views of a part of the projection apparatus in FIG. 1A and FIG. 1B. Referring to FIG. 1A to FIG. 2B, this embodiment provides a projection apparatus 100, which may be mounted on a door or a rear view mirror of a car, and is configured to project diversified patterns, animations or images, so that a user may obtain content and related information that are to be displayed by the car, and may experience freshness, and topics that involve interaction with people are increased. The projection apparatus 100 includes a housing 110, a light-transmissive cover 120, and a projection module 105. The housing 110 includes an opening A. The projection module 105 is arranged in the housing 110. The housing is made of a light-proof material, and is configured to accommodate the projection module 105. The light-transmissive cover 120 is arranged on the housing 110 to cover the opening A of the housing 110. The light-transmissive cover 120 is made of a light-transmissive material, and is configured to be connected to the opening A of the housing 110, to wrap the projection module 105, and allow light projected by the projection module 105 to pass. In this embodiment, the light-transmissive cover 120 includes a connection port D, so that the projection module 105 is connected to an external power supply by using the connection port D, to supply power to the projection module 105 for use.

Figure 3A:
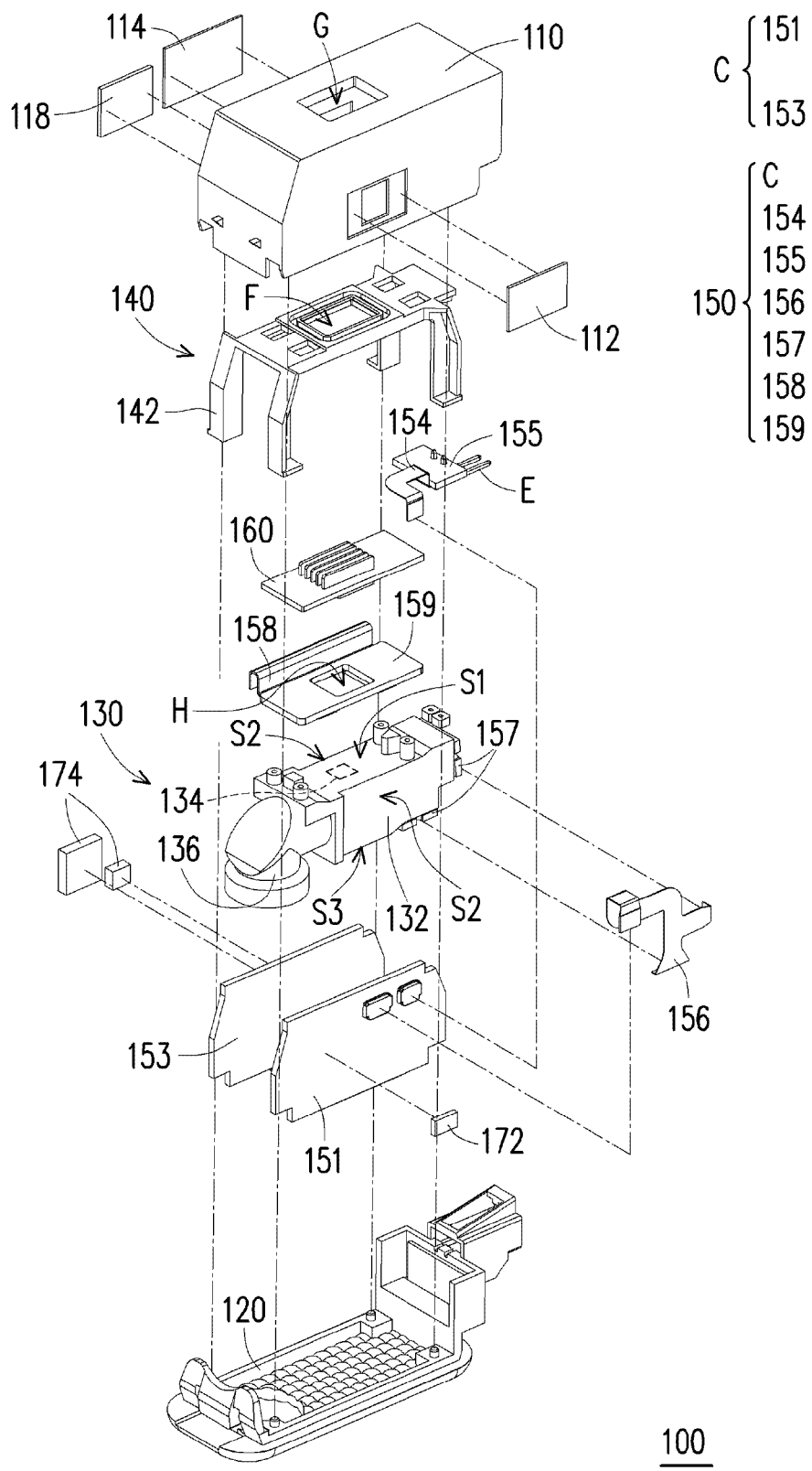
FIG. 3A and FIG. 3B are respectively three-dimensional exploded views of the projection apparatus in FIG. 1A and FIG. 1B.
Figure 3B:
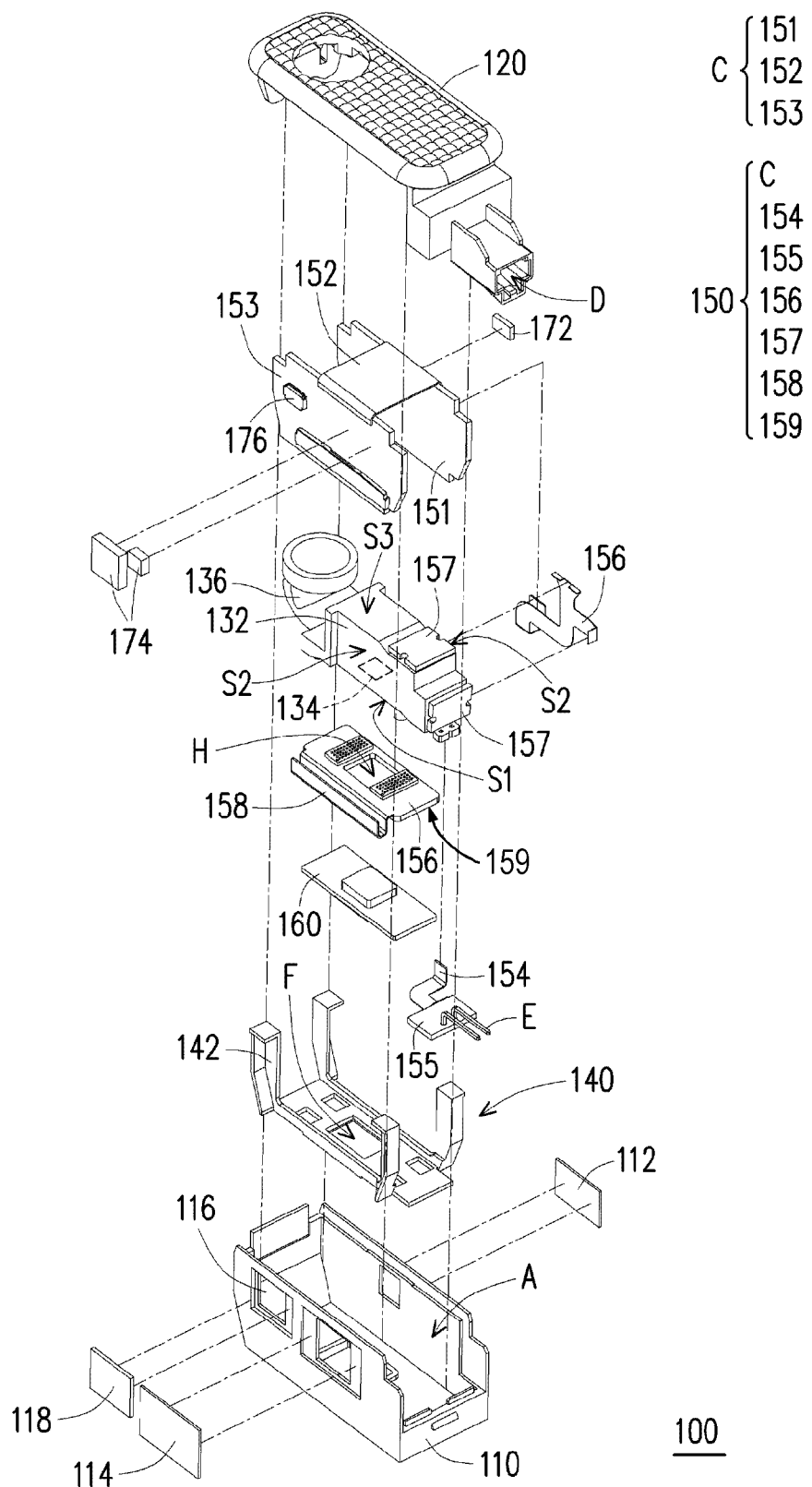

FIG. 3A and FIG. 3B are respectively three-dimensional exploded views of the projection apparatus in FIG. 1A and FIG. 1B. Referring to FIG. 1A to FIG. 3B, specifically, the projection module 105 is formed by an optical engine module 130, a frame 140, and a projection apparatus and media player circuit module 150. In other words, the projection apparatus 100 further includes the optical engine module 130, the frame 140, and the projection apparatus and media player circuit module 150. As shown in FIG. 3A, the optical engine module 130 is arranged in the housing 110, and is configured to provide a projection light beam L to be transmitted through the light-transmissive cover 120. The optical engine module 130 has a top surface S1, a plurality of side surfaces S2, and a bottom surface S3.

The optical engine module 130 includes an illumination system 132, a light valve 134, and a projection lens 136. The illumination system 132, for example, is a combination of at least one light emitting element and at least one optical element, such as a light emitting diode or a laser light source. The light valve 134, for example, is a reflective light modulator such as a digital micro-mirror device (DMD) or a liquid crystal on silicon (LCOS). However, this is not limited in the disclosure. The projection lens 136, for example, is a combination of one or more dioptric optical lenses. In this embodiment, the illumination system 132 provides an illumination light beam to the light valve 134. The light valve 134 converts the illumination light beam into an image light beam. Finally, the image light beam is projected out of the optical engine module 130 by the projection lens 136, to form the projection light beam L. Sufficient teachings, suggestions, and implementation descriptions on detailed steps and implementations of the method of converting the illumination light beam into the image light beam by the light valve 134 and the method of projecting the image light beam as the projection light beam L by the projection lens 136 can be obtained from common knowledge in the technical field. Therefore, the descriptions thereof are omitted herein.

The frame 140 is arranged on the top surface S1 of the optical engine module 130, and includes a plurality of extension arms 142 extending in a direction (for example, a gravity direction) away from the top surface S1. Specifically, the frame 140 is configured to allow a three-dimensional circuit board or other electronic elements of the projection apparatus and media player circuit module 150 to be secured on the frame 140 and secured between adjacent extension arms 142. Therefore, the three-dimensional circuit board or other electronic elements of the projection apparatus and media player circuit module 150 may be parallel to an inner wall of the housing 110 when secured between the adjacent extension arms 142, thereby achieving an objective of saving space. A material of the frame 140 may be metal or plastic. The disclosure is not limited to this. The three-dimensional circuit board means that a plurality of electronic elements is welded and assembled on a circuit board.

The projection apparatus and media player circuit module 150, for example, includes a central processing unit (CPU), or other programmable general-purpose or specific-purpose microprocessors, a digital signal processor (DSP), a programmable controller, an application specific integrated circuit (ASIC), a programmable logic device (PLD), or other similar apparatuses, or a combination of these apparatuses, and a play chip or circuit that may decode and play an image format and a voice format. The used chip or circuit may be known to a person skilled in the art. This is not limited in the disclosure.

The projection apparatus and media player circuit module 150 is configured to drive the optical engine module 130, and to decode and play a pattern or an image that are to be displayed. The projection apparatus and media player circuit module 150 is arranged on the extension arms 142, to be distributed on at least two of the plurality of side surfaces S2 and the bottom surface S3 of the optical engine module 130, and the side surfaces S2 are perpendicular to the top surface S1. In this embodiment, the projection apparatus and media player circuit module 150 includes a first circuit board 151, a first connection portion 152, and a second circuit board 153. The first circuit board 151 is connected to the second circuit board 153 by the first connection portion 152. The first connection portion 152 is a flexible circuit board, and the first connection portion 152 is perpendicular to the first circuit board 151 and the second circuit board 153. It means that an arranged position of the first connection portion 152 is perpendicular to arranged positions of the first circuit board 151 and the second circuit board 153. In other words, the first circuit board 151 and the second circuit board 153 are disposed in parallel, and the two circuit boards may be bent to a three-dimensional circuit board design architecture with an angle by the flexible first connection portion 152. That is, the first connection portion 152 is perpendicular to the first circuit board 151 and the second circuit board 153 to form a U-shaped three-dimensional printed circuit board (PCB)/printed circuit board assembly (PCBA) circuit design architecture.

In this embodiment, the first circuit board 151 and the second circuit board 153, for example, have lengths of 38 mm, heights of 20 mm, and thicknesses of 1.2 mm. The first circuit board 151 has one 4-pin connection port and one 6-pin connection port, and the second circuit board 153 has one 50-pin connection port and one 6-pin connection port. In other embodiment, the two circuit boards may be replaced with flexible circuit boards. However, the disclosure is not limited to this.

For example, in this embodiment, the first circuit board 151 is arranged between two adjacent extension arms 142, to be distributed on one of the side surfaces S2 of the optical engine module 130, that is, the first circuit board 151 is arranged on one of the side surfaces S2 of the optical engine module 130. The second circuit board 153 is arranged between another two adjacent extension arms 142, to be arranged on another one of the side surfaces S2 of the optical engine module 130. That is, the first circuit board 151 and the second circuit board 153 are respectively arranged on two opposite side surfaces S2 of the optical engine module 130. The first connection portion 152 is distributed on the bottom surface S3 of the optical engine module 130 in a suspended manner. However, the disclosure is not limited to this. The first circuit board 151 is electrically connected to the illumination system 132, and the second circuit board 153 is electrically connected to the light valve 134. In other words, the first circuit board 151, the first connection portion 152, and the second circuit board 153 form a three-dimensional circuit structure C. For example, a plurality of electronic elements is assembled on a printed circuit board assembly (PCBA). Therefore, a circuit structure may be designed to be not distributed on a single plane through cooperation of a circuit board and a flexible circuit board, so that the circuit design and planning have good space utilization. In this way, circuit design space may be increased, a combination time is reduced, and a volume is reduced.

In this embodiment, the first circuit board 151 includes a first heat dissipation member 172, adhered to a first heat dissipation portion 112 of the housing 110. The second circuit board 153 includes at least one second heat dissipation member 174, adhered to a second heat dissipation portion 114 of the housing 110. The first heat dissipation member 172 and at least one second heat dissipation member 174, for example, are heat dissipation blocks made of metal with a good heat conduction property. The first heat dissipation portion 112 and the second heat dissipation portion 114, for example, are heat dissipation plates made of metal with a good heat conduction property. Therefore, when a part needs to be replaced, the first heat dissipation portion 112 and the second heat dissipation portion 114 may be removed from the housing 110 to perform subsequent replacement. In addition, in this embodiment, the second circuit board 153 includes an input interface 176, which may be connected to an external control apparatus (a personal computer or a handheld control apparatus), and is configured to test functions, update software (SW) and firmware (FW), or debug. The input interface 176, for example, is a connection port such as a serial peripheral interface (SPI), a universal asynchronous receiver/transmitter (UART), a joint test action group (JTAG), and a universal serial bus (USB). The housing 110 includes an interface window 116 and a removable cover plate 118 configured to cover the interface window 116. Therefore, when function testing, software update, or repair needs to be performed, the removable cover plate 118 may be removed from the housing 110 to allow the external control apparatus or a jig to be connected to the input interface 176 through the interface window 116.

In this embodiment, the projection apparatus and media player circuit module 150 further includes an input/output driving circuit board 155 and a second connection portion 154. The input/output driving circuit board 155 is distributed on the top surface S1 of the optical engine module 130, and is connected to the first circuit board 151 by the second connection portion 154. Similar to the first connection portion 152, the second connection portion 154 is a flexible circuit board, and a normal line direction of the input/output driving circuit board 155 is perpendicular to a normal line direction of the first circuit board 151. It means an arranged position of the input/output driving circuit board 155 is perpendicular to an arranged position of the first circuit board 151. For example, one end of the second connection portion 154 is connected to the input/output driving circuit board 155, and the other end of the second connection portion 154 is connected to the 4-pin connection port of the first circuit board 151 by using a 4-pin connector. The input/output driving circuit board 155 includes an input portion E extending into the connection port D of the light-transmissive cover 120 to be connected to an external power supply. In this embodiment, the input portion E is a 2-pin connector. However, the disclosure is not limited to this.

In this embodiment, the projection apparatus and media player circuit module 150 further includes at least one light source circuit board 157 and a third connection portion 156. The at least one light source circuit board 157 is distributed on at least one of the side surfaces S2 and the bottom surface S3 of the optical engine module 130, to be connected to the illumination system 132. In this embodiment, there are two light source circuit boards 157, which are respectively distributed on the side surface S2 and the bottom surface S3 of the optical engine module 130. The two light source circuit boards 157 are connected to the first circuit board 151 by the third connection portion 156. The third connection portion 156 is a flexible circuit board, and the two light source circuit boards 157 are respectively perpendicular to the normal line direction of the first circuit board 151. For example, the third connection portion 156 has two branch portions respectively connected to the two light source circuit boards 157. The other end of the third connection portion 156 is connected to the 6-pin connection port of the first circuit board 151 by using a 6-pin connector.

In this embodiment, the projection apparatus and media player circuit module 150 further includes a light valve circuit board 159 and a fourth connection portion 158. The light valve circuit board 159 is distributed on the top surface S1 of the optical engine module 130, to be connected to the light valve 134. The light valve circuit board 159 is connected to the second circuit board 153 by the fourth connection portion 158. The fourth connection portion 158 is a flexible circuit board, and the light valve circuit board 159 is perpendicular to a normal line direction of the second circuit board 153. For example, one end of the fourth connection portion 158 is connected to the light valve circuit board 159, and the other end of the fourth connection portion 158 is connected to the 50-pin connection port of the second circuit board 153 by using a 50-pin connector. However, the disclosure is not limited to this.

In this embodiment, the projection apparatus 100 further includes a heat dissipation module 160 arranged on the light valve circuit board 159. One side of the heat dissipation module 160 protrudes and extends through an opening F of the frame 140, and is exposed from an opening G on the top of the housing 110, to be in contact with outside air. Specifically, the heat dissipation module 160, for example, includes a heat dissipation element formed by a heat dissipation plate and a heat dissipation fin. The heat dissipation fin of the heat dissipation module 160 passes through the opening F of the frame 140, and is exposed from the opening G on the top of the housing 110, to be in contact with outside air. The other side of the heat dissipation module 160 protrudes, and extends and passes through an opening H of the light valve circuit board 159, to be in contact with parts of the top surface S1 of the optical engine module 130 and a rear side of the light valve 134. Therefore, the heat dissipation member may be secured on the frame 140 to dissipate heat of the light valve circuit board 159 and the light valve 134.

Figure 3C:
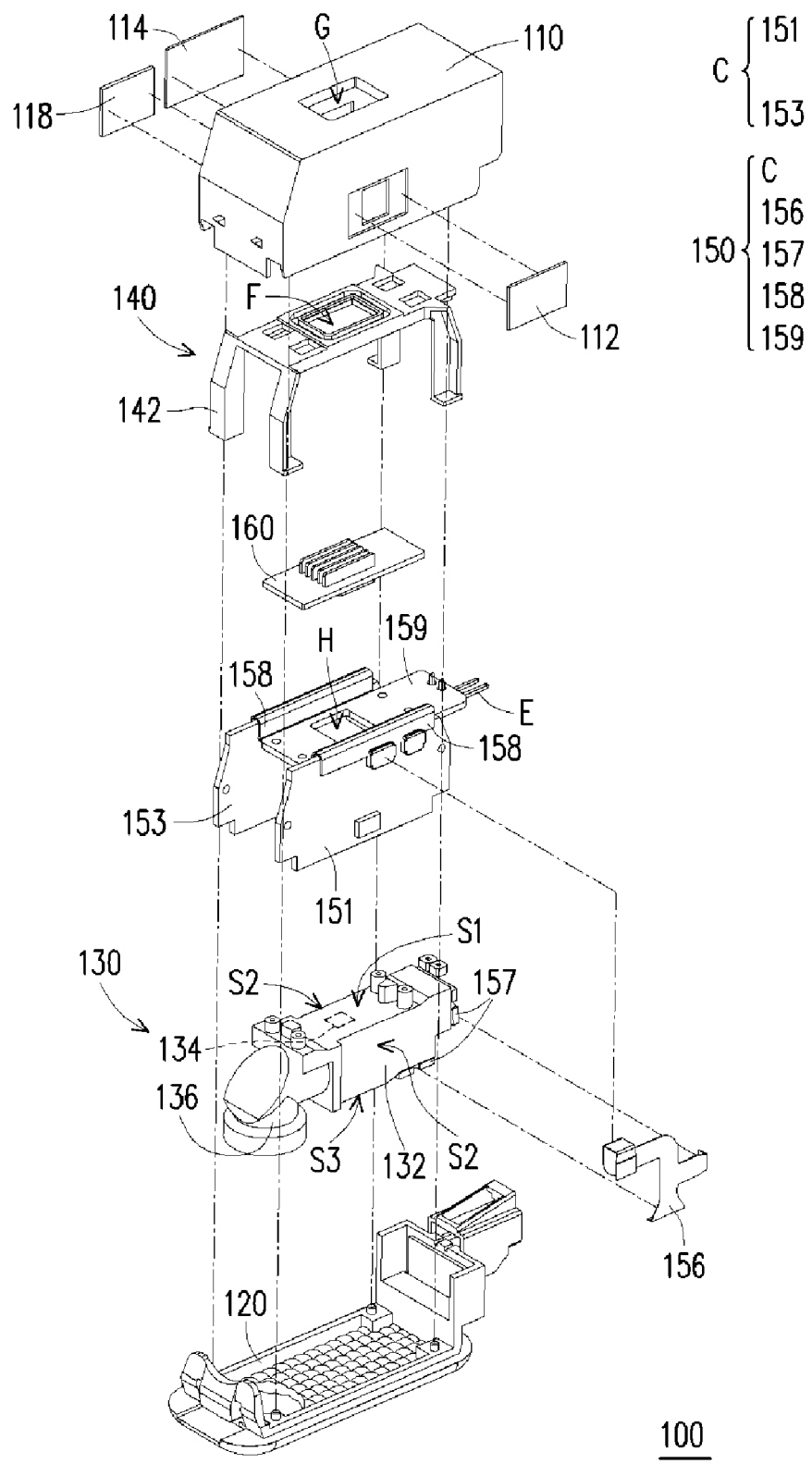
FIG. 3C is a three-dimensional exploded view of another projection apparatus in the disclosure.

FIG. 3C is a three-dimensional exploded view of another projection apparatus in the disclosure. A difference between three-dimensional explosions in FIG. 3C and FIG. 3A is that: in the embodiment in FIG. 3C, the first circuit board 151 is electrically connected to the light valve circuit board 159 by a fourth connection portion 158 (for example, a flexible circuit board), and then is electrically connected to the second circuit board 153 by another fourth connection portion 158. In other words, the light valve circuit board 159 disposed on the top surface S1 of an optical engine module 130 is used to connect the first circuit board 151 and the second circuit board 153 by using two flexible circuit boards (the fourth connection portions 158) on the left and right to form a three-dimensional circuit structure, which may increase circuit board design space, reduce a combination time, and reduce a volume. In addition, an input/output driving circuit board 155 includes an input portion E, which may be entirely disposed on the light valve circuit board 159, to reduce a volume of a circuit board. However, the disclosure is not limited to this.

Figure 4:
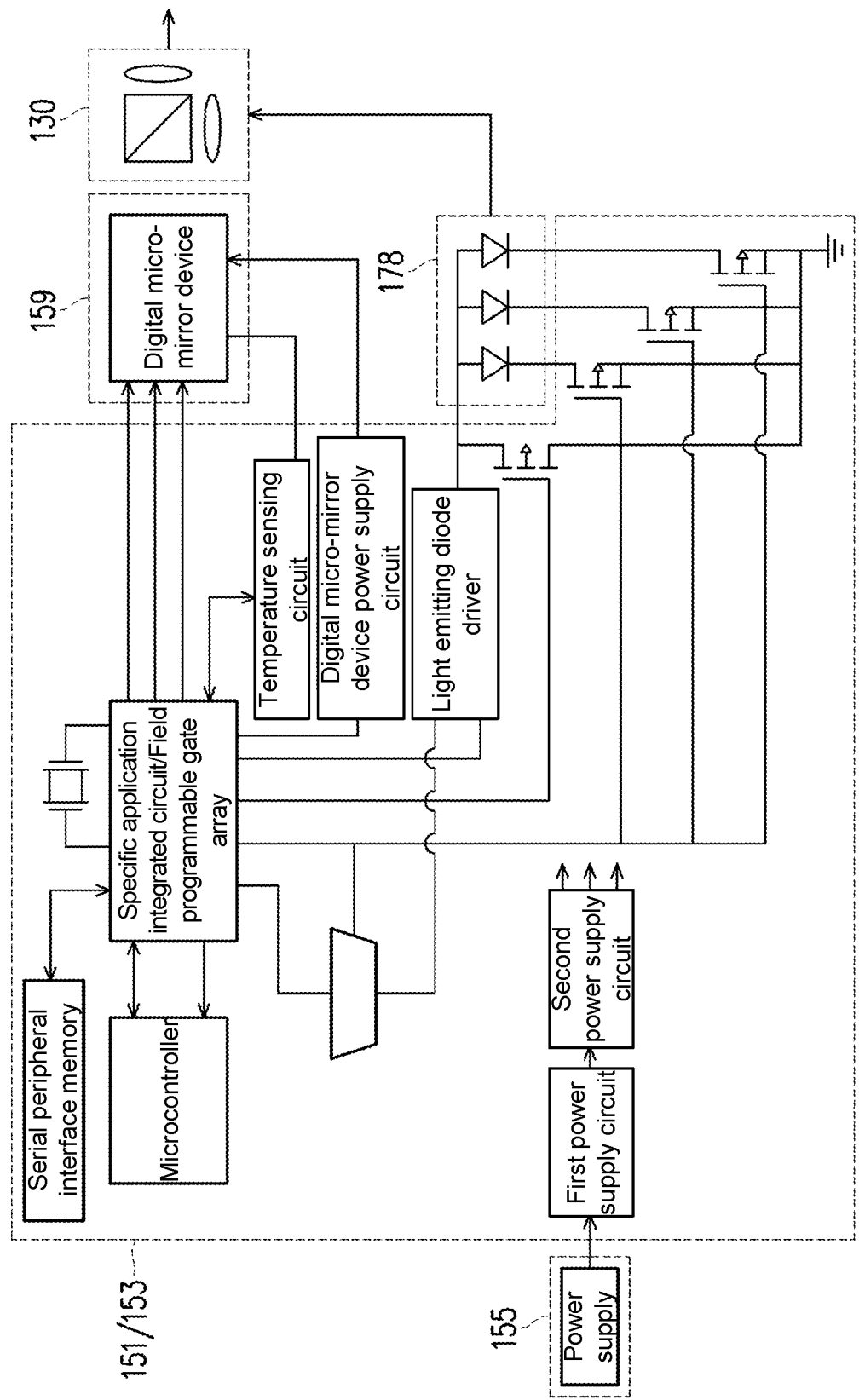
FIG. 4 is a functional block diagram of a projection apparatus according to an embodiment of the disclosure.

FIG. 4 is a functional block diagram of a projection apparatus according to an embodiment of the disclosure. Referring to FIG. 3A to FIG. 4, circuit functions displayed in this embodiment at least may be applied to the projection apparatus 100 in FIG. 3A and FIG. 3B. Therefore, the projection apparatus 100 in FIG. 3A and FIG. 3B is used as an example for description. In this embodiment, the first circuit board 151 may be used as a power supply and a light source circuit board of the projection apparatus 100, and is configured to distribute the power supply to each driving circuit board. The second circuit board 153 may be used as a mainboard of the projection apparatus 100, is configured to perform calculation and signal processing, control each driving circuit board, and decode a pattern, an animation, or an image that are to be played. The input/output driving circuit board 155 may be used as a circuit board, in the projection apparatus 100, connected to an external power supply, and is configured to transmit the external power supply to the first circuit board 151 and the second circuit board 153. One of the first circuit board 151 and the second circuit board 153 may have a first power supply circuit and a second power supply circuit. The first power supply circuit receives power transmitted from the external power supply, and is configured to reduce a voltage value. The second power supply circuit distributes different voltage values to different circuit boards. The first circuit board 151 and the second circuit board 153 may have a serial peripheral interface memory, a specific application integrated circuit/field programmable gate array, a digital micro-mirror device power supply circuit, a light emitting diode driver, and a temperature sensing circuit. These actual devices represent the above-mentioned circuits with full functions.

The light source circuit board 157 may be used as a circuit board, in the projection apparatus 100, connecting a light emitting element 178 in the illumination system 132 to the first circuit board 151, and is configured to receive a signal to drive the light emitting element 178 in the illumination system 132. As shown in FIG. 4, the light valve circuit board 159 may be used as a circuit board, in the projection apparatus 100, connecting the light valve 134 to the second circuit board 153, and is configured to receive a signal to drive the light valve 134.

In addition, a temperature sensing circuit is disposed on the second circuit board 153, and is configured to sense a temperature change of the light valve 134 connected to the light valve circuit board 159.

Based on the above, the embodiments of the disclosure at least have one of the following advantages or effects. In the projection apparatus in the disclosure, the projection apparatus and media player circuit module may be planned to be arranged on the top surface of the frame and between adjacent extension arms. Therefore, a circuit structure may be designed to be not distributed on a single plane, so that the circuit design and planning have good space utilization. In this way, a goal of satisfying a full-function specification design may be achieved by increasing circuit design space, reducing a combination time, and reducing a volume.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. Moreover, these claims may refer to use "first", "second", etc. following with noun or element. Such terms should be understood as a nomenclature and should not be construed as giving the limitation on the number of the elements modified by such nomenclature unless specific number has been given. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A projection apparatus, comprising a housing, a light-transmissive cover, an optical engine module, a frame, and a projection apparatus and media player circuit module, wherein
the housing comprises an opening,
the light-transmissive cover is arranged on the housing to cover the opening of the housing,
the optical engine module is configured to provide a projection light beam to be transmitted through the light-transmissive cover, and the optical engine module is arranged in the housing,
the frame is arranged on a top surface of the optical engine module, and the frame comprises a plurality of extension arms extending in a direction away from the top surface, and
the projection apparatus and media player circuit module is configured to drive the optical engine module, and to decode and play a pattern or an image, the projection apparatus and media player circuit module is arranged on the plurality of extension arms to be distributed on at least two of a plurality of side surfaces and a bottom surface of the optical engine module, and the plurality of side surfaces are perpendicular to the top surface,
wherein the projection apparatus and media player circuit module comprises a first circuit board, a first connection portion, and a second circuit board, the first circuit board is connected to the second circuit board by the first connection portion, the first connection portion is a flexible circuit board, and the first connection portion is perpendicular to the first circuit board and the second circuit board.

2. The projection apparatus of claim 1, wherein the first circuit board, the first connection portion, and the second circuit board form a three-dimensional circuit structure, the first circuit board is arranged between two adjacent extension arms to be distributed on one of the plurality of side surfaces of the optical engine module, the second circuit board is arranged between another two adjacent extension arms to be distributed on another one of the plurality of side surfaces of the optical engine module, and the first connection portion is distributed on the bottom surface of the optical engine module in a suspended manner.

3. The projection apparatus of claim 1, wherein the projection apparatus and media player circuit module further comprises an input/output driving circuit board and a second connection portion, the input/output driving circuit board is distributed on the top surface of the optical engine module and is connected to the first circuit board by the second connection portion, the second connection portion is a flexible circuit board, and the input/output driving circuit board is perpendicular to the first circuit board.

4. The projection apparatus of claim 3, wherein the light-transmissive cover comprises a connection port, the input/output driving circuit board comprises an input portion, and the input portion extends into the connection port to be connected to a power supply.

5. The projection apparatus of claim 1, wherein the optical engine module comprises an illumination system, a light valve, and a projection lens, the illumination system is electrically connected to the first circuit board, and the light valve is electrically connected to the second circuit board.

6. The projection apparatus of claim 5, wherein the projection apparatus and media player circuit module further comprises at least one light source circuit board and a third connection portion, the at least one light source circuit board is distributed on at least one of the plurality of side surfaces and the bottom surface of the optical engine module to be connected to the illumination system, and is connected to the first circuit board by the third connection portion, the third connection portion is a flexible circuit board, and the at least one light source circuit board is perpendicular to the first circuit board.

7. The projection apparatus of claim 5, wherein the projection apparatus and media player circuit module further comprises a light valve circuit board and a fourth connection portion, the light valve circuit board is distributed on the top surface of the optical engine module to be connected to the light valve, and is connected to the second circuit board by the fourth connection portion, the fourth connection portion is a flexible circuit board, and the light valve circuit board is perpendicular to the second circuit board.

8. The projection apparatus of claim 7, wherein each of the housing, the frame, and the light valve circuit board comprises an opening, the projection apparatus further comprises a heat dissipation module arranged on the top surface of the optical engine module, one side of the heat dissipation module protrudes and extends through the opening of the light valve circuit board to be in contact with the top surface of the optical engine module, and another side of the heat dissipation module protrudes and extends through the opening of the frame to be exposed from the opening of the housing.

9. The projection apparatus of claim 1, wherein the first circuit board comprises a first heat dissipation member adhered to a first heat dissipation portion of the housing.

10. The projection apparatus of claim 1, wherein the second circuit board comprises at least one second heat dissipation member adhered to a second heat dissipation portion of the housing.

11. The projection apparatus of claim 1, wherein the second circuit board comprises an input interface, and the housing comprises an interface window, and a removable cover plate covering the interface window.

* * * * *